US006258505B1

(12) United States Patent
Bhatt et al.

(10) Patent No.: US 6,258,505 B1
(45) Date of Patent: Jul. 10, 2001

(54) HEAT AND RADIATION-SENSITIVE IMAGING MEDIUM, AND PROCESSES FOR USE THEREOF

(75) Inventors: Jayprakash C. Bhatt, Waltham; Daoshen Bi, Burlington; F. Richard Cottrell, South Easton; Rong C. Liang, Newton; William C. Schwarzel, Billerica; Tung F. Yeh, Waltham, all of MA (US)

(73) Assignee: Polaroid Corporation, Cambridge, MA (US)

( * ) Notice: Subject to any disclaimer, the term of this patent is extended or adjusted under 35 U.S.C. 154(b) by 0 days.

(21) Appl. No.: 09/518,045

(22) Filed: Mar. 2, 2000

Related U.S. Application Data

(62) Division of application No. 09/108,624, filed on Jul. 1, 1998, now Pat. No. 6,054,246.

(51) Int. Cl.[7] ..................... G03F 7/021

(52) U.S. Cl. ..................... 430/157; 430/151; 430/156; 430/162; 430/259; 430/262; 430/263

(58) Field of Search ..................... 430/151, 156, 430/157, 162, 259, 262, 263

(56) References Cited

U.S. PATENT DOCUMENTS

| | | | |
|---|---|---|---|
| 4,073,968 | 2/1978 | Miyamoto et al. | 427/54 |
| 4,255,491 | 3/1981 | Igarashi et al. | 428/537 |
| 4,333,984 | 6/1982 | Igarashi et al. | 428/336 |
| 4,341,403 | 7/1982 | Igarashi et al. | 282/27.5 |
| 4,390,616 | 6/1983 | Sato et al. | 430/338 |
| 4,401,717 | 8/1983 | Ikeda et al. | 428/425.1 |
| 4,415,633 | 11/1983 | Nakamura et al. | 428/411 |
| 4,416,939 | 11/1983 | Igarashi et al. | 428/323 |
| 4,436,920 | 3/1984 | Sato et al. | 549/227 |
| 4,442,179 | 4/1984 | Igarashi et al. | 428/220 |
| 4,455,346 | 6/1984 | Igarashi et al. | 346/200 |
| 4,460,626 | 7/1984 | Nakamura et al. | 427/150 |
| 4,466,007 | 8/1984 | Nakamura et al. | 346/200 |
| 4,471,073 | 9/1984 | Ikeda et al. | 346/208 |
| 4,479,138 | 10/1984 | Ikeda et al. | 346/207 |
| 4,520,377 | 5/1985 | Iwakura et al. | 346/208 |
| 4,539,578 | 9/1985 | Igarashi et al. | 346/207 |
| 4,554,566 | 11/1985 | Yoneda et al. | 346/207 |
| 4,628,335 | 12/1986 | Igarashi et al. | 346/208 |
| 4,644,377 | 2/1987 | Satomura et al. | 346/221 |
| 4,646,113 | 2/1987 | Igarashi et al. | 346/209 |
| 4,665,411 | 5/1987 | Kiritani et al. | 346/216 |
| 4,707,464 | 11/1987 | Takashima et al. | 503/216 |
| 4,717,593 | 1/1988 | Igarashi et al. | 427/150 |
| 4,728,633 | 3/1988 | Satomura et al. | 503/221 |
| 4,751,213 | 6/1988 | Satomura et al. | 503/218 |
| 4,760,048 | 7/1988 | Kurihara et al. | 503/204 |
| 4,771,032 | 9/1988 | Yamaguchi et al. | 503/201 |
| 4,786,629 | 11/1988 | Kawakami et al. | 503/200 |
| 4,792,542 | 12/1988 | Takashima et al. | 503/208 |
| 4,797,384 | 1/1989 | Igarashi et al. | 503/200 |
| 4,797,385 | 1/1989 | Igarashi et al. | 503/207 |
| 4,822,771 | 4/1989 | Igarashi et al. | 503/226 |
| 4,833,118 | 5/1989 | Kawakami et al. | 503/208 |
| 4,833,121 | 5/1989 | Ikeda et al. | 503/214 |
| 4,842,979 | 6/1989 | Ishige et al. | 430/138 |
| 4,847,236 | 7/1989 | Satomura et al. | 503/208 |
| 4,855,278 | 8/1989 | Igarashi et al. | 503/208 |
| 4,855,282 | 8/1989 | Satomura et al. | 503/218 |
| 4,865,939 | 9/1989 | Usami et al. | 430/138 |
| 4,885,271 | 12/1989 | Kawakami et al. | 503/214 |
| 4,888,321 | 12/1989 | Kawakami et al. | 503/208 |
| 4,891,297 | 1/1990 | Takashima et al. | 430/177 |
| 4,892,858 | 1/1990 | Nakamine et al. | 503/227 |
| 4,895,826 | 1/1990 | Watanabe et al. | 503/202 |
| 4,923,844 | 5/1990 | Itabashi et al. | 503/207 |
| 4,981,836 | 1/1991 | Yanagihara et al. | 503/218 |
| 4,981,837 | 1/1991 | Tanaka et al. | 503/227 |
| 4,985,391 | 1/1991 | Ikeda et al. | 503/208 |
| 4,987,117 | 1/1991 | Itabashi et al. | 503/200 |
| 5,047,308 | 9/1991 | Usami | 430/138 |
| 5,089,371 | 2/1992 | Nakamura et al. | 430/160 |
| 5,095,316 | 3/1992 | Hakkaku | 346/1.1 |
| 5,110,848 | 5/1992 | Igarashi et al. | 524/30 |
| 5,168,029 | 12/1992 | Igarashi et al. | 430/138 |
| 5,180,652 | 1/1993 | Yamaguchi et al. | 430/281 |
| 5,216,438 | 6/1993 | Nakao et al. | 346/76 PH |
| 5,236,800 | 8/1993 | Nakamura et al. | 430/138 |
| 5,244,769 | 9/1993 | Yanagihara et al. | 430/138 |

(List continued on next page.)

FOREIGN PATENT DOCUMENTS

| | | |
|---|---|---|
| 190609046 | 4/1997 | (DE) . |
| 284378 | 9/1988 | (EP) . |
| 2113680 | 8/1993 | (GB) . |
| 58-108192 | 6/1983 | (JP) . |
| 60-4092 | 1/1985 | (JP) . |
| 1-110984 | 4/1989 | (JP) . |
| 2-4570 | 1/1990 | (JP) . |
| 2-204085 | 8/1990 | (JP) . |

*Primary Examiner*—John S. Chu
(74) *Attorney, Agent, or Firm*—Tim A. Cheatham; Gaetano D. Maccarone

(57) ABSTRACT

An imaging medium comprises a substrate carrying a color-change layer. This color-change layer comprises two layers or phases comprising two color-forming reagents which react upon heating to cause a change in the color of the layer. The color-change layer is deactivated by exposure to actinic radiation such that after deactivation it no longer undergoes its thermal color-change. The color-change layer is detachable from the substrate by heating to a temperature lower than required to cause the color change, so that upon contact of the imaging medium with a receiving sheet each individual pixel of the color-change layer may be left attached to the substrate, transferred to the receiving sheet but left uncolored, or transferred to the receiving sheet and colored to a color level determined by the energy used in the associated thermal print head element. The medium may be imaged by imagewise heating, followed by blanket exposure to deactivating actinic radiation, or by imagewise exposure to the actinic radiation, followed by heating of the whole color-change layer.

15 Claims, 1 Drawing Sheet

U.S. PATENT DOCUMENTS 5,268,707 12/1993 Katsuma et al. .................. 346/76 R
5,277,501 1/1994 Tanaka et al. ...................... 400/120
5,283,152 2/1994 Feldman et al. .................... 430/138
5,286,703 2/1994 Wachi et al. ........................ 503/221
5,288,688 2/1994 Kawakami et al. ................ 503/217
5,296,329 3/1994 Sugiyama et al. .................. 430/138
5,326,740 7/1994 Kamosaki et al. .................. 503/227
5,328,796 7/1994 Shimomura et al. ............... 430/138
5,342,132 8/1994 Tanaka et al. ................. 400/120.18
5,376,495 12/1994 Washizu et al. .................... 430/138
5,376,952 12/1994 Kokubo et al. ............... 346/761 PH
5,407,890 4/1995 Ishikawa et al. ................... 503/201
5,409,880 4/1995 Itabashi et al. ..................... 503/204
5,410,335 4/1995 Sawano et al. ..................... 347/171
5,416,500 5/1995 Tohdo ................................. 347/171
5,420,094 5/1995 Araki et al. ......................... 503/216
5,464,804 11/1995 Kawakami et al. ................ 503/217
5,480,765 1/1996 Yanagihara et al. ................ 430/338
5,486,856 1/1996 Katsuma et al. .................... 347/175
5,514,636 5/1996 Takeuchi ............................. 503/207
5,525,571 6/1996 Hosoi .................................. 503/200
5,534,905 7/1996 Takahashi et al. .................. 347/171
5,537,140 7/1996 Hayashi et al. ...................... 347/175
5,550,097 8/1996 Shibasaki et al. .................. 503/201
5,583,555 12/1996 Tabasso ............................... 347/213
5,593,938 1/1997 Takeuchi ............................. 503/206
5,600,359 2/1997 Kibuchi ............................... 347/171
5,608,441 3/1997 Takahashi et al. .................. 347/171
5,612,281 3/1997 Kobayashi et al. ................. 503/227
5,629,729 5/1997 Fujishiro ............................. 347/175
5,661,101 8/1997 Washizu et al. .................... 503/226

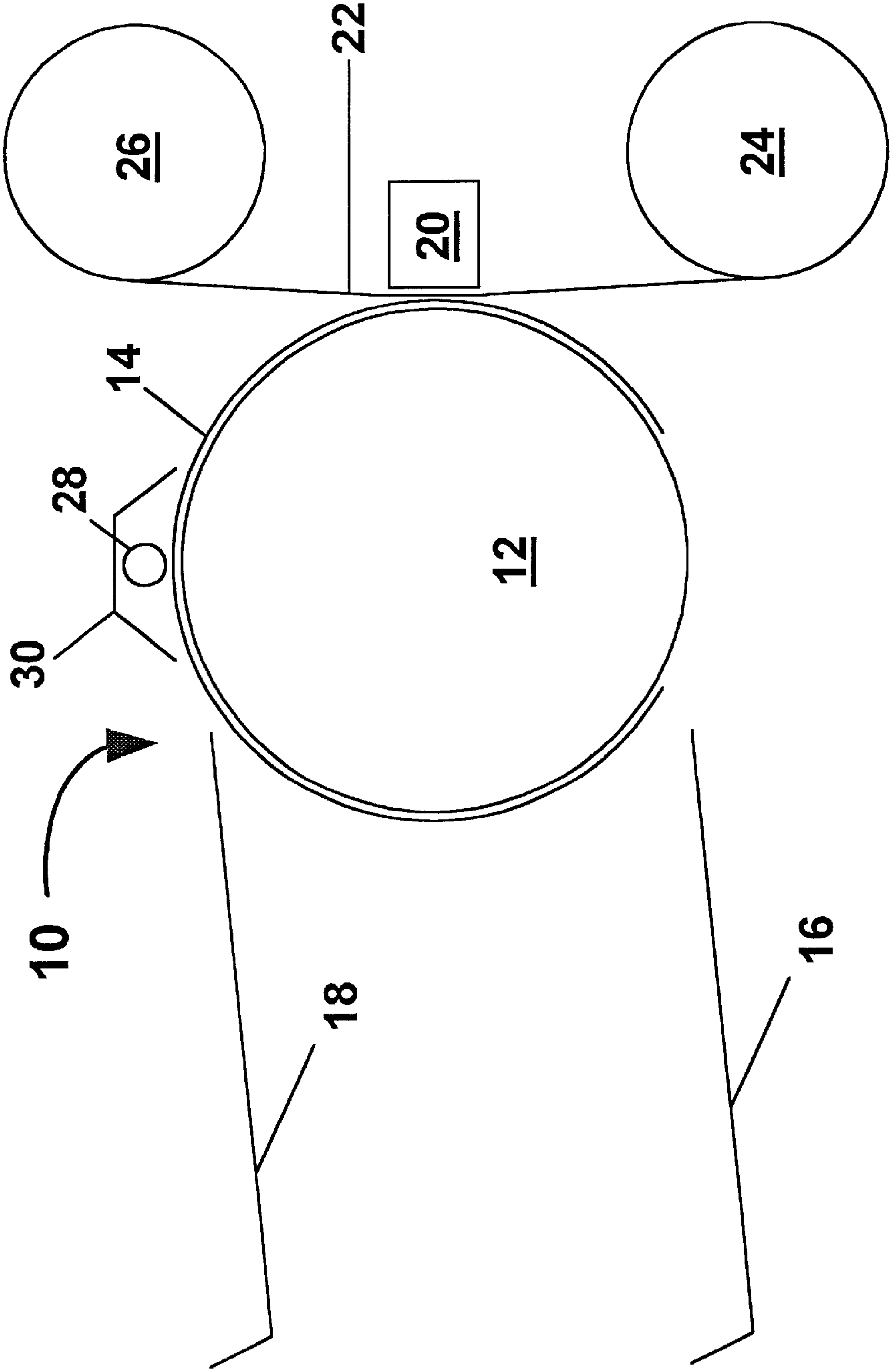
22
26
24
20
14
28
12
30
10
18
16

HEAT AND RADIATION-SENSITIVE IMAGING MEDIUM, AND PROCESSES FOR USE THEREOF

This is a division of application Ser. No. 09/108,624, filed Jul. 1, 1998 now U.S. Pat. No. 6,054,246.

BACKGROUND OF THE INVENTION

This invention relates to a heat and radiation-sensitive imaging medium and to processes for the use thereof.

Printers based upon a process known as "thermal wax transfer", or, more correctly, "thermal mass transfer" are available commercially. Such printers use an imaging medium (usually called a "donor sheet" or "donor web") which, in the case of a color printer, comprises a series of panels of differing colors. Each panel comprises a substrate, typically a plastic film, carrying a layer of fusible material, conventionally a wax, containing a dye or pigment of the relevant color. To effect printing, a panel is contacted with a receiving sheet, which can be paper or a similar material, and passed across a thermal printing head, which effects imagewise heating of the panel. At each pixel where head is applied by the thermal head, the layer of fusible material containing the dye or pigment transfers from the substrate to the receiving sheet, thereby forming an image on the receiving sheet. To form a full color image, the printing operation is repeated with panels of differing colors so that three or four images of different colors are superposed on a single receiving sheet.

Thermal wax transfer printing is relatively inexpensive and yields images which are good enough for many purposes. However, the resolution of the images which can be produced in practice is restricted since the separation between adjacent pixels is at least equal to the spacing between adjacent heating elements in the thermal head, and this spacing is subject to mechanical and electrical constraints. Also, the process is essentially binary; any specific pixel on one donor panel either transfers or does not, so that producing continuous tone images requires the use of dithering, stochastic screening or similar techniques to simulate continuous tone. Finally, some difficulties arise in accurately controlling the color of the images produced. The size of the wax particle transferred tends to vary depending upon whether an isolated pixel, or a series of adjacent pixels are being transferred, and this introduces granularity into the image and may lead to difficulty in accurate control of gray scale. Also, any given pixel in the final image may have 0, 1, 2, 3 or 4 superimposed wax particles, and the effects of the upper particles upon the color of the lower particles may lead to problems in accurate control of color balance.

Printers are also known using a process known as "dye diffusion thermal transfer" or "dye sublimation transfer". This process is generally similar to thermal wax transfer in that a series of panels of different colors are placed in succession in contact with a receiving sheet, and heat is imagewise applied to the panels by means of a thermal head to transfer dye from the panels to the receiving sheet. In dye diffusion thermal transfer processes, however, there is no mass transfer of a binder containing a dye; instead a highly diffusible dye is used, and this dye alone transfers from the panel to the receiving sheet without any accompanying binder. Dye diffusion thermal transfer processes have the advantages of being inherently continuous tone (the amount of dye transferred at any specific pixel can be varied over a wide range by controlling the heat input to that pixel of the panel) and can produce images of photographic quality.

However, the process is expensive because special dyes having high diffusivity, and a special receiving sheet, are required. Also, this special receiving sheet usually has a glossy surface similar to that of a photographic print paper, and the glossy receiving sheet limits the types of images which can be produced; one cannot, for example, produce a image with a matte finish similar to that produced by printing on plain paper, and images with such a matte finish may be desirable in certain applications. Finally, problems may be encountered with images produced by dye diffusion thermal transfer because the highly diffusible dyes tend to "bleed" within the image, for example, when contacted by oils from the fingers of users handling the images.

Finally, there is one thermal imaging system, described in, inter alia, U.S. Pat. Nos. 4,771,032; 5,409,880; 5,410,335; 5,486,856; and 5,537,140, and sold by Fuji Photo Film Co., Ltd. under the Registered Trademark "AUTOCHROME" which does not depend upon transfer of a dye, with or without a binder or carrier, from a donor to a receiving sheet. This process uses a recording sheet having three separate superposed color-forming layers, each of which develops a different color upon heating. The top color-forming layer develops color at a lower temperature than the middle color-forming layer, which in turn develops color at a lower temperature than the bottom color-forming layer. Also, at least the top and middle color-forming layers can be deactivated by actinic radiation of a specific wavelength (the wavelength for each color-forming layer being different, but both typically being in the near ultra-violet) so that after deactivation the color-forming layer will not generate color upon heating.

This recording sheet is imaged by first imagewise heating the sheet so that color is developed in the top color-forming layer, the heating being controlled so that no color is developed in either of the other two color-forming layers. The sheet is next passed beneath a radiation source of a wavelength which deactivates the top color-forming layer, but does not deactivate the middle color-forming layer. The sheet is then again imagewise heated by the thermal head, but with the head producing more heat than in the first pass, so that color is developed in the middle color-forming layer, and the sheet is passed beneath a radiation source of a wavelength which deactivates the middle color-forming layer. Finally, the sheet is again imagewise heated by the thermal head, but with the head producing more heat than in the second pass, so that color is developed in the bottom color-forming layer.

In such a process, it is difficult to avoid crosstalk between the three color-forming layers since, for example, if it is desired to image an area of the top color-forming layer to maximum optical density, it is difficult to avoid some color formation in the middle color-forming layer. Insulating layers may be provided between the color-forming layers to reduce such crosstalk, but the provision of such insulating layers adds to the cost of the medium. Print energy tends to be high, since the third pass over the thermal head to form color in the bottom color-forming layer requires heating of this layer through two superposed color-forming layers, and two insulating layers, if these are present. Finally, the need for at least two radiation sources to produce two well-separated wavelengths adds to the cost and complexity of the apparatus required.

The present invention provides a thermal mass transfer process and medium which allows continuous tone imaging without the need for highly diffusible dyes and which thus allows the production of images on a variety of media, including plain paper.

SUMMARY OF THE INVENTION

Accordingly, this invention provides a first process for producing an image using an imaging medium comprising a substrate carrying a color-change layer, this color-change layer comprising at least a first layer or phase comprising a first color-forming reagent and a second layer or phase comprising a second color-forming reagent, the two reagents being capable of reacting, upon heating of the medium, to cause a change in the color of the color-change layer, the color-change layer being deactivated by exposure to actinic radiation such that after deactivation heating of the color-change layer will no longer cause a change in the color thereof. In the process, the color-change layer is transferred from the substrate to a receiving sheet and is imagewise heated on the receiving sheet, thereby causing an imagewise change in the color of this color-change layer. After the imagewise heating, the color-change layer is exposed to the actinic radiation, thereby deactivating the color-change layer. This first process of the present invention may hereinafter be called the "imagewise-heating process."

This invention also provides a second process which uses the same type of imaging medium as the first process. However, in the second process, the color-change layer is first imagewise exposed to the actinic radiation, thereby causing imagewise deactivation of this layer, and the color-change layer is transferred from the substrate to a receiving sheet. After the imagewise exposure, the color-change layer is heated to a temperature sufficient to cause the color change in the parts of the color-change layer not deactivated by the exposure to the actinic radiation, thereby causing an imagewise color-change in the color-change layer. This second process of the present invention may hereinafter be called the "imagewise-exposure process."

This invention also provides an imaging medium comprising a substrate carrying a color-change layer, this color-change layer comprising at least a first layer or phase comprising a first color-forming reagent and a second layer or phase comprising a second color-forming reagent, the two reagents being capable of reacting, upon heating of the medium above a first thermal energy level (hereinafter for convenience denoted "$E_1$"), to cause a change in the color of the color-change layer, the color-change layer being deactivated by exposure to actinic radiation such that after deactivation heating of the color-change layer will no longer cause a change in the color thereof, the color-change layer being detachable from the substrate by heating to a second thermal energy level ("$E_2$") lower than the first thermal energy level ($E_1$), such that upon contact of the imaging medium with a receiving sheet and heating of the color-change layer above the second thermal energy level ($E_2$), the color-change layer will detach from the substrate and adhere to the receiving sheet.

Finally, this invention provides a web of imaging medium having a plurality of first panels alternating with a plurality of second panels. In this medium, each of the first panels comprises a first substrate carrying a first color-change layer, this first color-change layer comprising at least a first layer or phase comprising a first color-forming reagent and a second layer or phase comprising a second color-forming reagent, the first and second reagents being capable of reacting, upon heating of the first color-change layer above a first thermal energy level ($E_1$), to cause a change in the color of the first color-change layer, the first color-change layer being deactivated by exposure to actinic radiation such that after deactivation heating of the first color-change layer will no longer cause a change in the color thereof, the first color-change layer being detachable from the first substrate by heating to a second thermal energy level ($E_2$) lower than the first thermal energy level ($E_1$), such that upon contact of one of the first panels with a receiving sheet and heating of the first color-change layer above the second thermal energy level ($E_2$), the first color-change layer will detach from the first substrate and adhere to the receiving sheet. Similarly, each of the second panels comprises a second substrate carrying a second color-change layer, this second color-change layer comprising at least a third layer or phase comprising a third color-forming reagent and a fourth layer or phase comprising a fourth color-forming reagent, the third and fourth reagents being capable of reacting, upon heating of the second color-change layer above a third thermal energy level ($E_3$), to cause a change in the color of the second color-change layer, the color-change undergone by the second color-change layer being different from that undergone by the first color-change layer, the second color-change layer being detachable from the second substrate by heating to a fourth thermal energy level ($E_4$) lower than the third thermal energy level ($E_3$), such that upon contact of one of the second panels with the receiving sheet and heating of the second color-change layer above the fourth thermal energy level ($E_4$), the second color-change layer will detach from the second substrate and adhere to the receiving sheet.

As noted above, in the medium of the present invention, the first thermal energy level $E_1$ required to cause color formation in the color-change layer is higher than the second thermal energy level $E_2$ required to cause transfer of the color-change layer to the receiving sheet. This ensures that, if desired, pixels of the color-change layer can be transferred to the receiving sheet without becoming colored. In saying that the first thermal energy level $E_1$ is higher than the second thermal energy level $E_2$, we do not imply that the temperature required for color formation must necessarily be higher than that required for transfer (although in many cases this will be true); the temperature required for color formation may be the same as that required for transfer, provided that a higher heat input is required for color formation. Similarly, in the web of the present invention $E_1 > E_2$, and $E_3 > E_4$, but there is not necessarily any relationship between $E_1$ and $E_3$, nor between $E_2$ and $E_4$; $E_1$ may be the same or different from $E_3$, and $E_2$ may be the same or different from $E_4$.

The actual color formation in the color-change layer may occur simultaneously with or after transfer of the color-change layer to the receiving sheet. For convenience, reference may hereinafter be made to "colored" and "uncolored" pixels to denote pixels which are colored or uncolored respectively in the color-change layer in its final form on the receiving sheet, regardless of whether the colored pixels have actually developed color at the point in the process being discussed.

BRIEF DESCRIPTION OF THE DRAWINGS

The accompanying drawing is a schematic side elevation of an apparatus for carrying out an imagewise-heating process of the present invention.

DETAILED DESCRIPTION OF THE INVENTION

As already indicated, the present processes use an imaging medium comprising a substrate carrying a color-change layer which develops color upon heating but which can be deactivated by actinic radiation of an appropriate wavelength so that after deactivation it no longer develops color upon heating. The color-change layer is separable from the substrate so that it can be transferred from the substrate to a receiving sheet. In practice, this transfer of the color-change layer from the substrate to the receiving sheet is usually effected by heating the color-change layer. To avoid unwanted development of color in the color-change layer during the transfer, as already indicated the thermal energy required for the transfer should of course be lower than that required to cause development of color in the color-change layer.

Very desirably, the color-forming reagents used in the processes and medium of the present invention are such that the density of the color developed as a result of the color change in the color-change layer varies with the thermal energy input to this layer. By using such color-forming reagents and varying the imagewise heating (in the imagewise-heating process) one can produce in the final image colored pixels of color-change layer having differing color densities, thus producing a continuous tone image, in contrast to the essentially binary images produced by conventional thermal mass transfer processes.

In some cases, the materials composing the color-change layer may have physical characteristics sufficient to cause the transfer without the need for any additional components. For example, if the color-change layer uses a wax as a binder or vehicle, heating this wax above its softening point may suffice to effect the transfer to an appropriate receiving sheet. In other cases, it may be desirable to include in the imaging medium a heat-activated adhesive capable of being activated at a thermal activation energy lower than that required to cause the color change in the color-change layer, so that the transfer of the color-change layer to the receiving sheet is effected by heating this layer above the thermal activation energy of the adhesive. This adhesive may be provided as a separate layer overlying the color-change layer, or may be present in at least part of the color-change layer itself. For example, if the color-change layer comprises two sublayers each containing one of the color-forming reagents, the adhesive might be present only in the "upper" sublayer, i.e., the sublayer remote from the substrate. In many cases, it may also be desirable to provide a strip layer disposed between the substrate and the color-change layer of the imaging medium, such that upon transfer of the color-change layer to the receiving sheet, separation of the color-change layer from the substrate occurs by separation at the strip layer. It may also be desirable to provide a heat-resistant layer on the opposed side of the substrate from the color-change layer to improve the thermomechanical stability of the medium during printing and/or to prevent the imaging medium sticking to the thermal head during printing.

Although the transfer of the color-change layer can be effected on a pixel-by-pixel basis (that is, with only the pixels needed to form the desired imagewise distribution of color transferred to the receiving sheet), when the present processes are used to form a continuous image (i.e., a photographic or similar image, which covers essentially every pixel within the image area, without any large gaps), it is preferred that the whole of the continuous image area of the color-change layer, including both colored and uncolored pixels, be transferred "bodily" to the receiving sheet; this type of transfer is usually called "panel transfer". In practice, to avoid unwanted effects at the edges of the continuous image area, it is also desirable to transfer a "frame" of uncolored pixels surrounding the continuous image area; this "frame" need normally only be one or two pixels wide. Panel transfer of the color-change layer avoids problems inherent in pixel-by-pixel transfer, for example (a) the variation in pixel size between isolated pixels, in which none of the adjacent pixels are transferred, and conjoined pixels, in which several adjacent pixels are transferred together; and (b) in full color images, variations in the image caused by differences in the number of color-change layers present at various pixels. If a CMY or CMYK image is formed by one of the present processes using panel transfer of the color-change layers, three or four color-change layers will be present at each pixel within the continuous image area, and experiments indicate that the presence of these multiple color-change layers is not objectionable to the eye. Panel transfer also produces an image with good appearance and mechanical properties, such as uniform gloss, good scratch resistance and less granularity along edges between colored and uncolored areas of the image. However, experiments also indicate that in areas containing text or images consisting of discrete objects with substantial gaps between objects, for example line art drawings (such areas containing text or images comprising discrete objects will hereinafter be called "discrete object image areas"), readers do not wish to have uncolored color-change layer pixels in the areas between the discrete objects, so that in such discrete object image areas it is advantageous to transfer essentially only those colored pixels comprising the discrete objects; in practice, it may again be desirable to transfer a frame of uncolored pixels around each area of colored pixels to avoid edge effects. Thus, the present processes are well suited to the production of compound documents comprising at least one continuous image area and at least one discrete object image area, since in such compound documents panel transfer of the color-change layer can be effected in the continuous image area, while essentially pixel-by-pixel transfer can be effected in the discrete object image area.

As will be apparent to those skilled in the imaging art, when the present process is used to prepare a color image, it will be necessary to use a plurality (typically three or four, depending upon whether a CMY or CMYK process is required; the present process could also use a larger number of colors, for example in a six, CCMMYY, or eight, CCMMYYKK, process) of imaging media capable of forming differing colors, and to transfer the color-change layers of the plurality of media to a single receiving sheet. Thus, typically in the imagewise-heating process of the invention, after the (first) color-change layer has been transferred to the substrate and deactivated, there is provided a second imaging medium comprising a second substrate carrying a second color-change layer. This second color-change layer comprises a third layer or phase comprising a third color-forming reagent and a fourth layer or phase comprising a fourth color-forming reagent, the third and fourth reagents being capable of reacting, upon heating of the medium, to cause a change in the color of the second color-change layer, this color-change of the second color-change layer being different from that of the (first) color-change layer containing the first and second reagents. Like the first color-change layer, the second one can be deactivated by exposure to actinic radiation such that after deactivation heating of the second color-change layer will no longer cause a change in the color thereof. The process includes the further steps of transferring the second color-change layer from the second substrate to the receiving sheet so that at least part of the second color-change layer is superposed on at least part of the first color-change layer already on the receiving sheet, imagewise heating the second color-change layer, thereby causing an imagewise change in the color of this layer; and, after the imagewise heating of the second color-change layer, exposing the second color-change layer to the actinic radiation, thereby deactivating the second color-change layer. Obviously, one can carry out a multicolor imagewise-exposure process of the invention in a similar manner, using imagewise-exposure of the second imaging medium to the radiation before transfer to the receiving sheet, and blanket heating of the second imaging medium to cause the color-change therein. Note that, unlike the process described in the aforementioned U.S. Pat. No. 4,771,032, the full color-processes of the invention can be, and preferably are, carried out using the same wavelength of radiation to effect deactivation of each of the color-change layers, since only one layer is deactivated at a time, and, even when the various imaging media are arranged as successive panels on a single web, there is no difficulty in arranging the apparatus so that, for example, the second and third panels of imaging medium are not exposed to the radiation used to deactivate the first panel. The ability to carry out a multicolor process with only a single radiation source allows a significant simplification and reduction in cost of the apparatus used to carry out the present processes, as compared with that required for the process of the aforementioned U.S. Pat. No. 4,771,032, especially since the present processes can use a source having a broad range of wavelengths, such as is generated by a typical ultraviolet tube.

The present process may include application to the receiving sheet of layers other than the color-forming layers. For example, a durable transparent protective layer containing an ultra-violet stabilizer may be applied to improve the mechanical durability and ultra-violet stability of the image. Such auxiliary layers may be applied from a set of non-color forming panels provided in the present web.

It will be appreciated that when the present imagewise-heating process is used to prepare a color image, it is not always necessary to deactivate the last color-change layer applied to the receiving sheet by exposing this last color-change layer to actinic radiation. In some cases, deactivation of the last color-change layer may occur by room lighting at ambient temperature. In other cases, the last color-change layer may contain a non-radiation deactivatable (hereinafter for convenience called "non-photodeactivatable") color-forming system, for example a lactone leuco dye of the type typically used in carbonless papers and thermal fax papers. If such a non-photodeactivatable color-forming system is employed, it should be chosen so that the thermal energy input required for color formation is large enough that unwanted additional color formation does not take place in the final image.

As already indicated, color-forming reagents capable of developing color on heating and of being deactivated by actinic radiation are known, and any of the known reagents may be used in the media and process of the present invention provided of course that they are compatible with the other components of the color-change layer. Preferred photodeactivatable color-forming reagents are a diazonium salt and a coupler for this salt; typically, a base is also included. Using these reagents, deactivation of the color-change layer can be effected by ultra-violet radiation, which decomposes the diazonium salt. Suitable salts and couplers are described, for example, in U.S. Pat. Nos. 4,705,736; 4,842,979; and 5,168,029, and in J. Imag. Tech., 11(3), 137 (1985) and J. Kosar, Light Sensitive Systems, Chapter 6 (1965). Preferred diazonium salts, couplers and bases are:

For Yellow Color-forming Layers:

Salts: 1-diazo-2,5-diethoxy-4-p-tolylmercaptobenzene tetrafluoroborate (available commercially from Andrews Paper & Chemical Co., 1 Channel Drive, Port Washington, N.Y. 11050–2216; this company is hereinafter abbreviated as "APC"); 1-diazo-2,5-diethoxy-4-p-tolylmercaptobenzene hexafluorophosphate (available from APC); 1-diazo-2,5-diethoxy-4-morphilinobenzene hexafluorophosphate (available from APC); 1-diazo-2,5-dibutoxy-4-morphilinobenzene hexafluorophosphate; and 2-morphilinosulfoamide benzene hexafluorophosphate.

Couplers: acetoacet-ortho-toluidide (available from APC); 3,3'-methylene bis(acetoacetanilide) (available from APC); acetoacet-benylamide (available from APC); acetoacetanilide (available from Aldrich Chemical Co., 1001 West Saint Paul Avenue, Milwaukee, Wis. 53233–2641); 4-chloroacetoacetanilide (available from Aldrich); and 3-carboxyamido-1-phenyl-2-pyrazolin-5-one.

Bases: di-2-tolylguanidine (available from Aldrich); triphenylguanidine (available from TCI Chemicals, 919 3rd Avenue, New York, N.Y. 10022–3902); and tricyclohexylguanidine.

Specific preferred combinations of these reagents which have been found to give good results in yellow color-forming layers are:

1. 1-diazo-2,5-diethoxy-4-p-tolylmercaptobenzene tetrafluoroborate, in combination with any one of acetoacet-ortho-toluidide, 3,3'-methylene bis(acetoacetanilide), acetoacetanilide, acetoacet-benylamide and 4-chloroacetoacetanilide, in the presence of di-2-tolylguanidine or triphenylguanidine as base.

2. 1-diazo-2,5-diethoxy-4-p-tolylmercaptobenzene hexafluorophosphate, in combination with any one of acetoacet-ortho-toluidide, 3,3'-methylene bis (acetoacetanilide), acetoacetanilide, acetoacet-benylamide and 4-chloroacetoacetanilide, in the presence of di-2-tolylguanidine or triphenylguanidine as base.

3. 1-diazo-2,5-diethoxy-4-morphilinobenzene hexafluorophosphate, in combination with acetoacet-ortho-toluidide or 3,3'-methylene bis(acetoacetanilide), in the presence of di-2-tolylguanidine or triphenylguanidine as base.

4. 1-diazo-2,5-dibutoxy-4-morphilinobenzene hexafluorophosphate with 3,3'-methylene bis(acetoacetanilide) in the presence of di-2-tolylguanidine or triphenylguanidine as base.

5. 2-morphilinosulfoamide benzene hexafluorophosphate with 3-carboxyamido-1-phenyl-2-pyrazolin-5-one in the presence of di-2-tolylguanidine or triphenylguanidine as base.

For Magenta Color-forming Layers:

Salts: 1-diazo-2,5-diethoxy-4-p-tolylmercaptobenzene tetrafluoroborate and 1-diazo-2,5-diethoxy-4-p-tolylmercaptobenzene hexafluorophosphate (both available from APC).

Coupler: 2-morphilinosulfoamido-5-amidomethylsulfon-1-naphthol.

Bases: the aforementioned di-2-tolylguanidine, triphenylguanidine and tricyclohexylguanidine.

Specific preferred combinations of these reagents which have been found to give good results in magenta color-forming layers are:

1. 1-diazo-2,5-diethoxy-4-p-tolylmercaptobenzene tetrafluoroborate with 2-morphilinosulfoamido-5-N-sulfomethylamido-1-naphthol, in the presence of di-2-tolylguanidine or triphenylguanidine as base.

2. 1-diazo-2,5-diethoxy-4-p-tolylmercaptobenzene hexafluorophosphate with 2-morphilinosulfoamido-5-N-sulfomethylamido-1-naphthol in the presence of di-2-tolylguanidine or triphenylguanidine as base.

For Cyan Color-forming Layers:

Salts: 4-nitro-2-methylsulfonate benzene diazonium hexafluorophosphate and 4-nitrobenzene diazonium tetrafluoroborate (available from Aldrich).

Coupler: 2-Morphilinosulfoamido-5-N-sulfomethylamido-1-naphthol

Base: triphenylguanidine

Specific preferred combinations of these reagents which have been found to give good results in cyan color-forming layers are:

1. 4-nitro-2-methylsulfonate benzene diazonium hexafluorophosphate with 2-morphilinosulfoamido-5-N-sulfomethylamido-1-naphthol in the presence triphenylguanidine. (Polar thermal solvents such as tetramethylene sulfone may be used to improve the maximum optical density, $D_{max}$, and control the hue of the color developed.)

2. 4-nitro benzene diazonium tetrafluoroborate with 2-morphilinosulfoamido-5-N-sulfomethylamido-1-naphthol in the presence of tetramethylene sulfone and triphenylguanidine.

The first and second reagents may be present in two separate sublayers within the color-forming layer, or in two separate phases within this layer. In many cases, it may be desirable to microencapsulate one of the reagents to improve the storage stability of the imaging medium while still maintaining high efficiency in photodeactivation and color formation upon heating; when the reagents comprise a diazonium salt, a coupler and a base, preferably the diazonium salt is the microencapsulated phase.

As already mentioned, it is sometimes desirable to use non-photo-deactivatable color-forming reagents, such as lactone leuco dyes, in one of the color-change layer layers, especially the cyan color-change layer. Such lactone leuco dyes are readily commercially available, for example from Hilton-Davis, Cincinnati, Ohio 45237.

In addition to the color-forming reagents, the color-forming layer will normally comprise a binder. The binders used in conventional thermal wax transfer imaging, for example natural or synthetic waxes or resins, may also be used in the present imaging medium. As already indicated, the color-change layer, or at least one sublayer thereof, may contain an adhesive to assist transfer of the color-change layer to the receiving sheet. The color-change layer may also comprise various optional components for purposes such as modifying the physical properties of the color-change layer to ensure good adhesion to the substrate prior to imaging and effective transfer to the receiving sheet during imaging, storage stability, color stability prior to imaging, rate of color formation during imaging (i.e., thermal sensitivity) and good handling properties. Such optional components may include plasticizers, thermal solvents, acid stabilizers, base catalysts, releasing agents and tackifiers. When a non-photodeactivatable color former is used in the last color-change layer applied, ultra-violet absorbers may be incorporated into this color-change layer to improve the light stability of the image. An excess of acid may also be incorporated into this layer to neutralize any excess base which may migrate from the underlying color-change layers.

The exact nature of the substrate used in the present imaging medium is not critical provided that this substrate provides adequate mechanical support for the color-change layer during storage, transport and imaging, has sufficient thermal conductivity not to interfere with the imaging process, and releases the color-change layer properly when required. In general, the same types of substrates used in conventional thermal wax media can also be used in the media of the present invention, although consideration should be given to the heat resistance of any proposed substrate, since the temperatures required for color-formation in the present process will usually be higher than the temperatures used in thermal wax transfer processes. Typically, the substrate will be a thin plastic film, such as that sold under the Registered Trademark "MYLAR" by E. I. du Pont de Nemours and Company, Wilmington, Del.; a film of this material 5 μm or less in thickness has been found to give good results, the presently preferred thickness being about 3.5 μm. As already indicated, the substrate may be provided with a release layer on the surface which will carry the color-change layer and/or a heat-resistant layer on the opposed surface.

After imaging, various post-treatment steps may be effected to vary the appearance of and/or to protect the image. For example, the image may be subjected to heat treatment to change its gloss, and may have a protective laminate secured over the color-change layer(s) to change the image's appearance or to protect it from mechanical damage. In some cases, instead of laminating a protective layer over the color-change layer(s), a suitable layer may be transferred by heat in the same way as the color-change layer(s) themselves. For example, if a full color process is effected using a web containing cyan, magenta and yellow color-forming panels, the web can also contain additional non-color-forming panels which can thermally transfer a protective coating over the image using the same thermal head as is used to form color in and transfer the cyan, magenta and yellow color-forming layers. Similarly, the web may contain additional non-color-forming panels arranged to apply a pretreatment layer to the receiving sheet, so that the printing is effected on the pretreatment layer rather than on the bare receiving sheet. Such a pretreatment layer may be useful in enabling the present processes to be used on a wider range of media than would be possible in the absence of the pretreatment layer; for example, if it is desired to form an image on a medium which is too rough for satisfactory printing, a pretreatment layer could be used to provide a smoother surface for the printing operation.

A preferred imagewise-heating process of the present invention will now be described, though by way of illustration only, with reference to the accompanying drawing, which shows a schematic side elevation of an apparatus for carrying out the preferred process.

The thermal printer apparatus (generally designated 10) shown in the accompanying drawing comprises a drum 12 mounted for rotation about a horizontal axis and provided with retaining means (not shown) for retaining a receiving sheet 14 thereon. The receiving sheet 14 may be of paper, a plastic film or other material and may be opaque, translucent or transparent. Adjacent the drum 12 are disposed an input tray 16 and an output tray 18 provided with conventional devices (not shown) for feeding paper on to the drum 12 and receiving paper from the drum respectively. A thermal print head 20 is also provided adjacent the drum 12 and is movable radially relative thereto (i.e., horizontally in the drawing) between a non-operating position, in which the print head is slightly spaced from the drum, and an operating position in which the print head closely approaches the drum, so that a nip is formed between the print head and the drum. As in conventional wax transfer imaging, the print head 20 extends the full width (perpendicular to the plane of the drawing) of the sheet 14 and comprises a linear array of individual heating elements, the heat output of each of which can be independently controlled by a computerized control system (not shown) in accordance with a digital representation of the image to be produced.

A web 22 of imaging medium of the invention is fed from a feed spool 24 through the nip formed between the print head 20 and the drum 12 and on to a take-up spool 26. Although not shown in the drawing, the web 22 comprises the following layers, in order from back to front (where "front" denotes the surface of the web which contacts the receiving sheet 14, i.e., the left hand surface in the FIGURE:

1. A thin (about 1 μm or less) heat resistant back coat, which prevents adjacent plies of the web 22 sticking to each other while the web is rolled up on the feed spool 24, and which also prevents the web sticking to the thermal print head during imaging;
2. A polyester film (about 3.5 μm thick), which provides the mechanical integrity of the web, and on which the other layers are coated by conventional coating techniques;
3. A strip coat serving to assist separation of the color-forming layer (see 4 and 5 below) from the polyester film during the imaging process; and
4. A color-forming layer containing a microencapsulated colorless diazonium salt dispersed in a continuous phase comprising a binder, a coupler for the diazonium salt and a base. (Alternatively, if is desired that one of the sets of panels (see below) of the web 22 use a non-photodeactivatable color former, this single color-forming layer may be replaced by two sublayers each comprising the binder, with one of the sublayers containing a leuco dye and the other containing an acid developer for this leuco dye.)

The web 22 comprises a series of panels, each of which is capable of forming yellow, cyan or magenta color, with the three types of panels being repeated cyclically throughout the web. As is well known to those skilled in the art of thermal wax transfer imaging, the web may bear markings between the panels which can be sensed by photodetectors adjacent the print head to ensure that each panel is accurately positioned relative to the receiving sheet before printing begins.

The apparatus 10 further comprises an ultra-violet or fluorescent tube 28 disposed adjacent the drum 12 and used to deactivate color-forming layer which has been transferred to the receiving sheet 14. The tube 28 is provided with a shield 30 which acts as a safety device to keep ultra-violet radiation away from the eyes of the operator, but also serves to ensure that stray radiation does not impinge upon parts of the web which have not yet been used for imaging, thereby avoiding accidental deactivation of parts of the web.

The apparatus 10 operates as follows. At the beginning of a print cycle, with the print head 20 in its non-operating position, a receiving sheet 14 is removed from the input tray 16 and fed into contact with the rotating drum 12, to which it is then clamped by the retaining means. The apparatus is arranged so that, once the receiving sheet 14 has been fully secured around the drum 12 and the leading edge of the sheet 14 approaches the print head 20, the take-up spool is driven to place the leading edge of a "yellow" panel of the web adjacent the print head 20. The print head is then moved to its operating position so that the yellow panel and the receiving sheet move at the same speed past the print head, which applies heat imagewise to the yellow panel, thereby causing transfer of the color-change sublayers from this panel to the receiving sheet and imagewise formation of yellow color within these sublayers to form a yellow image on the receiving sheet.

As previously mentioned, the transfer of the color-change layer from the substrate to the receiving sheet may take place either areally, with both colored and uncolored pixels being transferred, or on a pixel-by-pixel basis, with only the colored pixels being transferred, with the former mode being preferred for continuous images and the latter for text or other discrete object image areas. If areal transfer is required, when heat generating elements of the print head 20 are not required to develop color, these elements are heated to a temperature high enough to transfer the color-change layer to the receiving sheet, but not high enough to cause color formation in the color-change layer. If, on the other hand, pixel-by-pixel transfer is desired, when heat generating elements of the print head 20 are not required to develop color, these elements may not be heated at all, so that only the colored pixels transfer. For compound documents containing both discrete object image and continuous image areas, both transfer modes are desirably used. Those skilled in the digital imaging art will be aware that software exists which can automatically distinguish between continuous image and text areas of a compound document, and such software may be used to ensure that the present apparatus uses the appropriate transfer mode on the various areas of a compound document.

As the receiving sheet 14 and the yellow panel of the web 22 leave the print head 20, they separate, with the receiving sheet remaining on the drum 12 while the panel travels towards the take-up spool 26. Separation of the transferred portion (which may be part or all) of the color-change sublayers of the web from the polyester film substrate takes place within the strip coat layer. The receiving sheet bearing the yellow color-change layer then travels beneath the tube 28, which deactivates the color-change layer.

Essentially the same process is repeated twice to produce magenta and cyan images on the receiving sheet 14 and to deactivate the magenta and cyan color-change layers, except that if a non-photodeactivatable color former is used in the last color-change layer to be applied, it is not necessary to expose this layer to the tube 28. Obviously, the dimensions of the apparatus and of the panels of the web must be adjusted so that (for example) as the leading edge of the receiving sheet approaches the print head 20 on its second pass through the head, the leading part of a magenta panel will also reach the print head. After all three images have been formed on the receiving sheet and the three color-forming layers deactivated, the receiving sheet is unclamped from the drum 12 and fed to the output tray 18.

EXAMPLE 1

This Example illustrates the preparation of a microencapsulated diazonium salt useful in imaging media of the present invention.

8.4 g of 1-diazo-2,5-dibutoxy-4-morpholinobenzene hexafluorophosphate (available under the trade name "Diazo 55 PF" from APC), 1.0 g of dodecylbenzenesulfonic acid, 0.6 g of di-t-butylhydroxytoluene (BHT) and 73.7 g of Desmodur E 744 (a polyisocyanate prepolymer based upon methylene diisocyanate, available from Bayer Corporation, 100 Bayer Road, Pittsburgh, Pa. 19205-9740) were mixed and heated to form a homogeneous solution. This solution was then added to a beaker containing 52.7 g of a 2:1 isocyanate:hydroxyl molar ratio precondensate of Robinate M (a polymeric methylene diisocyanate, available for ICI Americas, Inc., Wilmington, Del.) and Poly-G 20–56 (a polypropylene oxide polyol, available from Olin Chemicals, Rochester, N.Y. 14601). The resultant mixture was added to a high shear blender containing a mixture of 7.2 g of Airvol 523 (a poly(vinyl alcohol), available from Air Products and Chemicals, Inc., Allentown Pa. 18195) and 232.8 g of water, kept at a temperature of 50° C. The resultant mixture was emulsified at high shear for 20 minutes, and then stirred at low shear for an additional 2 hours, both at 50° C. A dispersion of microcapsules having a volume average particle size of 1.4 μm was produced. The resultant microcapsule slurry was filtered through a 50 μm filtration cartridge and then through a 10 μm filtration cartridge before use.

EXAMPLE 2

This Example illustrates the preparation of a second microencapsulated diazonium salt useful in imaging media of the present invention.

Diazo 55 PF (6.0 g) was dissolved in a mixture of neopentyl dibenzoate (12.0 g) and pentaerythritol tetrabenzoate (12 g). Thereafter, 36.6 g of Desmodur E 744 and 2.1 g of Tone Polyol 0200 (a polycaprolactone diol available from Union Carbide Corporation, Danbury, Conn.) were added to the solution. The resultant mixture was stirred at 50° C. to form a precondensate of the polyol and the polyisocyanate, then mixed in a high shear blender with an aqueous solution (120 g) containing 2.3% by weight of Airvol 523 and 0.45% by weight of Aerosol OT. The resultant mixture was emulsified at high shear in the blender for 15 minutes at 50° C. An aqueous solution (30 g) containing 0.5% by weight of Airvol 523 preconditioned to 50° C. was then added, and the resultant mixture stirred under low shear for an additional 3 hours at 50° C. A dispersion of microcapsules having a volume average particle size of 2.1 μm was produced. The resultant microcapsule slurry was filtered through a 50 μm filtration cartridge and then through a 10 μm filtration cartridge before use.

EXAMPLE 3

This Example illustrates the preparation of a magenta imaging medium of the present invention.

4 g of a coupling agent of the formula:

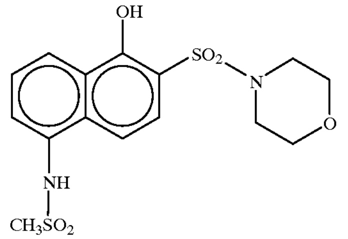

and 24 g of zirconium silicate beads were added to a solution containing 13.17 g of deionized water and 2.83 g of a 7.1% solution of a dispersant, TAMOL 731. The resultant mixture was stirred at 500 rpm for 24 hours, then separated from the beads by decantation. The volume average particle size of the resultant coupler dispersion was 1.3 μm.

Separately, 4 g of triphenylguanidine (TPG) and 24 g of zirconium silicate beads were added to a solution containing 15.8 g of deionized water, 2 g of a 10% solution of a surfactant (Surfynol 104) and 3.6 g of a 10% solution of partially hydrolyzed poly(vinyl alcohol) (87–89% hydrolyzed, molecular weight 15,000–27,000). The resultant mixture was stirred at 500 rpm for 24 hours, then separated from the beads by decantation. The volume average particle size of the resultant TPG dispersion was 2.0 μm.

To prepare the coating fluid, a 5% sodium carbonate solution was added drop by drop to 2.37 of the microencapsulated diazonium salt dispersion prepared in Example 1 above until the pH of the dispersion reached 6. 2.22 g of deionized water, 0.56 g of the coupler dispersion, 0.56 g of JB 750 latex (available from S.C. Johnson Wax, 1525 Howe Street, Racine, Wis. 53403-5011), 1.39 g of the TPG dispersion, and 2.91 g of Cabosphere A 205 silica (available from Cabot Corporation, Cab-O-Sil Division, 700 East U.S. Highway 36, Tuscola, Ill. 61953) were added sequentially to the microencapsulated dispersion under constant stirring at 400 rpm.

The coating composition thus prepared was coated on to a 3.5 μm poly(ethylene terephthalate) film provided with a 0.25 μm wax release top coat and a 0.25 μm heat-resistant back coat, using a Myrad bar; the intended coating thickness was 3 μm, and the coating was dried in air. The imaging medium thus prepared was used in an Alantek thermal printer equipped with a 300 dpi. thermal head printing at a speed of 0.55 inch/sec (14 mm/sec). A continuous tone magenta image and a good quality text image were transferred successfully to a variety of receiving sheets, including photocopier paper and a dye diffusion thermal transfer receiving sheet.

EXAMPLE 4

This Example illustrates the preparation of a magenta imaging medium of the present invention.

Example 3 was repeated except that the microencapsulated diazonium salt dispersion prepared in Example 1 above was replaced by that prepared in Example 2 above. Again, a continuous tone magenta image and a good quality text image were transferred successfully to a variety of receiving sheets, including photocopier paper and a dye diffusion thermal transfer receiving sheet.

EXAMPLE 5

This Example illustrates the preparation of a microencapsulated diazonium salt useful in a yellow imaging medium of the present invention.

Example 1 was repeated except that the diazonium salt "Diazo 55PF" used in Example 1 was replaced by 1-diazo-2,5-diethoxy-4-p-tolylmercaptobenzene hexafluorophosphate ("Diazo 72PF, available from APC).

EXAMPLE 6

This Example illustrates the preparation of a yellow imaging medium of the present invention.

Example 3 was repeated except that the coupler was replaced by acetoacetanilide (Coupler 633, available from APC) and the microencapsulated Diazo 55PF used in Example 3 was replaced by the microencapsulated Diazo 72PF prepared in Example 5. A continuous tone yellow image and a good quality text image were transferred successfully to a variety of receiving sheets, including photocopier paper and a dye diffusion thermal transfer receiving sheet.

EXAMPLE 7

This Example illustrates the preparation of a non-photodeactivatable cyan imaging medium of the present invention.

10 g of a cyan leuco dye (Copichem 39, available from Hilton-Davis) was dispersed in an aqueous mixture comprising 10% poly(vinyl alcohol) (8 g), Triton TX 100 surfactant (0.1 g) and 32 g of deionized water, using an attriter equipped with zirconium silicate beads and stirred for 20 hours at ambient temperature. The average particle size of the resulting dispersion was about 2 μm.

Separately, an acid developer, 2,2-bis(p-hydroxyphenyl) propane (BPA, 10 g) was dispersed in an aqueous mixture comprising 10% poly(vinyl alcohol) (8 g), Triton TX 100 surfactant (0.1 g) and 32 g of deionized water, using an attriter equipped with zirconium silicate beads and stirred for 20 hours at ambient temperature. The average particle size of the resulting dispersion was about 2 $\mu$m.

Aqueous dispersions of an ultra-violet absorber (Tinuvin-P, available from Ciba-Geigy Corporation, 7 Skyline Drive, Hawthorne N.Y. 10532-2188) and an antioxidant (Irganox 1010, also available from Ciba-Geigy) were prepared in a similar manner.

The dispersions thus prepared, together with dispersions of titanium dioxide, and JB 750 were then mixed in the proportions stated in Table 2 below to give a final coating composition.

TABLE 2

| | % Solids in dried film |
|---|---|
| Cyan leuco dye | 15 |
| $TiO_2$ | 20 |
| Ultra-violet absorber | 3 |
| Antioxidant | 5 |
| JB750 | 22 |
| BPA | 35 |

The coating composition thus prepared was coated on to a 3.5 $\mu$m poly(ethylene terephthalate) film provided with a 0.25 $\mu$m wax release top coat and a 0.25 $\mu$m heat-resistant back coat, using a Myrad bar; the intended coating thickness was 3 $\mu$m, and the coating was dried in air. The imaging medium thus prepared was used in an Alantek thermal printer equipped with a 300 dpi. thermal head printing at a speed of 0.55 inch/sec (14 mm/sec). A high density continuous tone cyan image and a good quality text image were transferred successfully to a variety of receiving sheets, including photocopier paper and a dye diffusion thermal transfer receiving sheet.

EXAMPLE 8

This Example illustrates the preparation of a second non-photodeactivatable cyan imaging medium of the present invention.

0.4 g of a gum arabic (available from T.I.C. Gum Company, 4609 Richlynn Drive, Belcamp, Md. 21017-1227) was dissolved in 15.6 g of deionized water and the pH of the solution was adjusted to 10.5 with 5% sodium carbonate solution. To this solution, 4 g of Copichem 39 an 12 g of zirconium silicate beads were added. The resultant mixture was stirred at 500 rpm. for 24 hours at room temperature, then separated from the beads by decantation. The volume average particle size of the resultant dispersion was about 2 $\mu$m.

4 g of Bisphenol A, 1 g of zinc di-t-butyl salicylate and 24 g of zirconium silicate beads were added to a solution containing 0.03 g of Triton X100 surfactant, 0.02 g of Aerosol OT, and 0.5 g of a partially hydrolyzed poly(vinyl alcohol) (87–89% hydrolyzed, molecular weight 70,000–101,000). The resultant mixture was stirred at 500 rpm for 24 hours, then separated from the beads by decantation. The volume average particle size of the resultant dispersion was about 2.0 $\mu$m.

4 g of Tinuvin P, 4 g of Irganox 1010 and 48 g of zirconium silicate beads were added to a solution containing 4 g of a 10% solution of Surfynol 104, 4 g of a 10% solution of a partially hydrolyzed poly(vinyl alcohol) (87–89% hydrolyzed, molecular weight 70,000–101,000) and 31.6 g of deionized water. The resultant mixture was stirred at 500 rpm for 24 hours, then separated from the beads by decantation. The volume average particle size of the resultant dispersion was about 2.0 $\mu$m.

2.96 g of the Bisphenol A/zinc di-t-butyl salicylate dispersion was diluted with 1.66 g of deionized water under constant stirring at 400 rpm. To the resultant dispersion were added, in order, 0.55 g of the Tinuvin P/Irganox 1010 dispersion, 1.32 of an styrene/butadiene latex (Rovene 6105, available from Mallard Creek Polymers, Inc., Akron, Ohio 44308), 0.5 g of polyethylene glycol 8000, 1.4 g of Cabosphere A205 silica, 1.6 g of the Copichem 39 dispersion and 0.1 g of a 2% solution of FC-120 surfactant (available from Minnesota Mining and Manufacturing Corporation, St. Paul, Minn., 55144-1000). The mixture thus prepared was coated on to a 3.5 $\mu$m poly(ethylene terephthalate) ribbon and printed in the same manner as in Example 7 above. A high density continuous tone cyan image and a good quality text image were transferred successfully to a variety of receiving sheets, including photocopier paper and a dye diffusion thermal transfer receiving sheet. The images also showed excellent archival stability.

It will be apparent to those skilled in the art that numerous changes and modifications can be made in the specific process and apparatus just described without departing from the scope of the present invention. For example, depending upon the thermal sensitivity of the various panels of the imaging medium, the available heat output from the thermal print head and the power and wavelength distribution of the ultra-violet source, it may be desirable to rotate the drum at differing speeds during the various image-forming and/or deactivation steps. The apparatus may be modified by substituting a four, six or eight color web, or any of the foregoing plus a clear panel which applies a protective coating to the image, in place of the three-color web described above. Alternatively, the apparatus may be modified to include a unit for laminating a protective (barrier) coating over either the completed image, or any of the transferred color-forming layers making up the image. Thus, for example, in a CMY system, one might introduce three barrier layers, one after each of the C, M and Y layers had been deposited on the receiving sheet. In particular, it has been found that when a CMY image is produced using the color-forming layers described above, placing a barrier layer between the cyan layer and the other two color-forming layers is helpful to the archival stability of the final images. The apparatus described above may also be modified to carry out an imagewise-exposure process of the invention by replacing the thermal head with a scanning radiation source (for example, a scanning laser beam) and replacing the ultra-violet tube with a heat source, which might, for example, be an infra-red lamp.

What is claimed is:

1. An imaging medium comprising a substrate carrying a color-change layer, this color-change layer comprising at least a first layer or phase comprising a first color-forming reagent and a second layer or phase comprising a second color-forming reagent, the two reagents being capable of reacting, upon heating of the medium above a first thermal energy level, to cause a change in the color of the color-change layer, the color-change layer being deactivated by exposure to actinic radiation such that after deactivation heating of the color-change layer will no longer cause a change in the color thereof, the color-change layer being detachable from the substrate by heating to a second thermal energy level lower than the first thermal energy level, such that upon contact of the imaging medium with a receiving sheet and heating of the color-change layer above the second thermal energy level, the color-change layer will detach from the substrate and adhere to the receiving sheet.

2. An imaging medium according to claim 1 wherein the density of color produced in the color-change layer varies with the thermal energy input to this layer.

3. An imaging medium according to claim 1 wherein the first and second reagents comprise a diazonium salt and a coupler for the diazonium salt.

4. An imaging medium according to claim 3 wherein the diazonium salt is decomposed by ultra-violet radiation, thereby deactivating the color-change layer.

5. An imaging medium according to claim 1 comprising a heat-activated adhesive which becomes activated at the second temperature.

6. An imaging medium according to claim 5 wherein the adhesive is present within at least part of the color-change layer.

7. An imaging medium according to claim 1 further comprising a strip layer disposed between the substrate and the color-change layer, such that upon transfer of the color-change layer to a receiving sheet, separation of the color-change layer from the substrate occurs by separation at the strip layer.

8. A web of imaging medium having a plurality of first panels alternating with a plurality of second panels, each of the first panels comprising a first substrate carrying a first color-change layer, this first color-change layer comprising at least a first layer or phase comprising a first color-forming reagent and a second layer or phase comprising a second color-forming reagent, the first and second reagents being capable of reacting, upon heating of the first color-change layer above a first thermal energy level, to cause a change in the color of the first color-change layer, the first color-change layer being deactivated by exposure to actinic radiation such that after deactivation heating of the first color-change layer will no longer cause a change in the color thereof, the first color-change layer being detachable from the first substrate by heating to a second thermal energy level lower than the first thermal energy level, such that upon contact of one of the first panels with a receiving sheet and heating of the first color-change layer above the second thermal energy level, the first color-change layer will detach from the first substrate and adhere to the receiving sheet; and each of the second panels comprising a second substrate carrying a second color-change layer, this second color-change layer comprising at least a third layer or phase comprising a third color-forming reagent and a fourth layer or phase comprising a fourth color-forming reagent, the third and fourth reagents being capable of reacting, upon heating of the second color-change layer above a third thermal energy level, to cause a change in the color of the second color-change layer, the color-change undergone by the second color-change layer being different from that undergone by the first color-change layer, the second color-change layer being detachable from the second substrate by heating to a fourth thermal energy level lower than the third thermal energy level, such that upon contact of one of the second panels with the receiving sheet and heating of the second color-change layer above the fourth thermal energy level, the second color-change layer will detach from the second substrate and adhere to the receiving sheet.

9. An imaging medium according to claim 8 wherein the second color-change layer is deactivated by exposure to actinic radiation such that after deactivation heating of the second color-change layer will not longer cause a change in the color thereof.

10. An imaging medium according to claim 9 wherein the first and second reagents and/or the third and fourth reagents comprise a diazonium salt and a coupler for the diazonium salt.

11. An imaging medium according to claim 10 wherein the diazonium salt is decomposed by ultra-violet radiation, thereby deactivating the color-change layer.

12. An imaging medium according to claim 8 wherein each of the first and second panels comprises a heat-activated adhesive, the heat-activated adhesive in the first panels becoming activated at the second thermal energy level and the heat-activated adhesive in the second panels becoming activated at the fourth thermal energy level.

13. An imaging medium according to claim 12 wherein the adhesive is present within at least part of the color-change layer of each panel.

14. An imaging medium according to claim 8 wherein each panel further comprises a strip layer disposed between the substrate and the color-change layer, such that upon transfer of the color-change layer to the receiving sheet, separation of the color-change layer from the substrate occurs by separation at the strip layer.

15. An imaging medium according to claim 8 wherein the second color-change layer is not deactivated by exposure to actinic radiation.

* * * * *